United States Patent [19]

Maserang et al.

[11] Patent Number: 4,884,171

[45] Date of Patent: Nov. 28, 1989

[54] ELECTROMAGNETIC INTERFERENCE SHIELDING DEVICE FOR A PORTABLE AIRCRAFT ENGINE TESTER

[75] Inventors: William L. Maserang, Fort Worth; John W. Wright, Arlington, both of Tex.

[73] Assignee: Howell Instruments, Fort Worth, Tex.

[21] Appl. No.: 284,729

[22] Filed: Dec. 15, 1988

[51] Int. Cl.[4] .............................................. H05K 5/04
[52] U.S. Cl. ..................................... 361/424; 333/12; 174/35 R
[58] Field of Search ............... 361/331, 380, 424, 429; 174/35 R, 35 GC; 200/304, 305; 333/12

[56] References Cited

U.S. PATENT DOCUMENTS

| | | | |
|---|---|---|---|
| 4,408,255 | 10/1983 | Adkins | 361/424 |
| 4,498,546 | 2/1985 | Peterson | 361/424 |
| 4,685,034 | 8/1987 | Tetsu | 174/35 R |
| 4,760,496 | 7/1988 | Koch | 174/35 R |
| 4,782,310 | 11/1988 | Saburi | 333/12 |
| 4,797,782 | 1/1989 | Wistling | 174/35 R |

Primary Examiner—Gerald P. Tolin
Attorney, Agent, or Firm—Cushman, Darby & Cushman

[57] ABSTRACT

A shielding device having an aluminum outer housing with an open top, an aluminum EMI filter box disposed within the outer housing containing thermocouple, AC signal, DC signal, and power EMI filters allow measurement signal input to an aircraft engine tester disposed within the shielding device. A display window formed of a conductive bezel, EMI gaskets, a woven bronze screen, and an aluminum backup panel, various switches, and a top access panel are mounted on a conductive deck covering the open top of the outer housing. Connections between conductive elements use closely spaced screws, high conductivity finishes, and EMI gaskets to ensure that high intensity EMI can be shielded from the aircraft engine tester enclosed within.

17 Claims, 9 Drawing Sheets

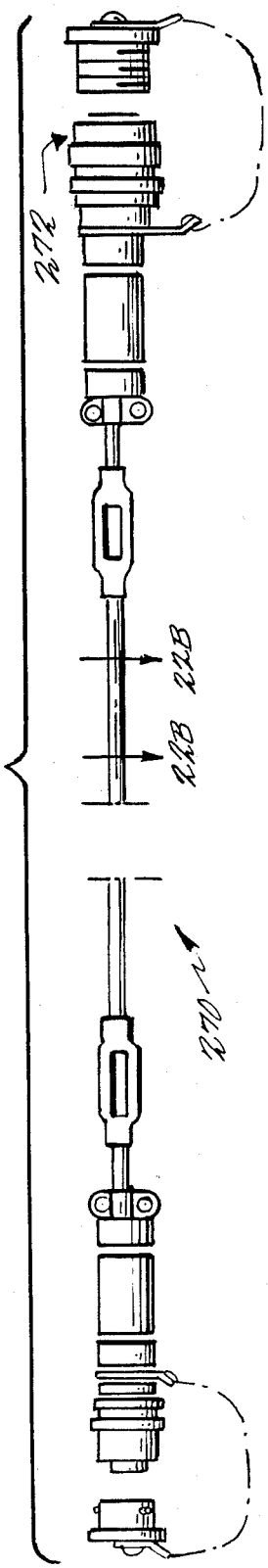
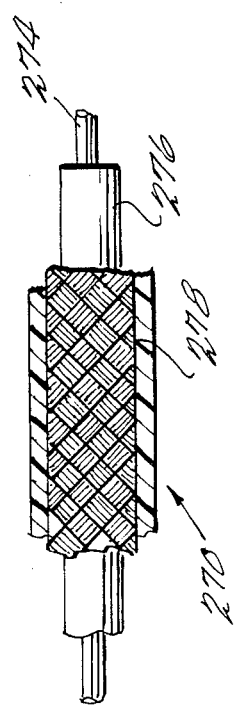
FIG. 22A
FIG. 22B

ELECTROMAGNETIC INTERFERENCE SHIELDING DEVICE FOR A PORTABLE AIRCRAFT ENGINE TESTER

BACKGROUND OF THE INVENTION

1. Field of the Art

This invention relates to an electromagnetic interference (hereinafter referred to as EMI) shielding device that encloses a portable aircraft engine tester used in areas of very high intensity EMI.

2. Description of the Prior Art

It is known to shield various electrical components from EMI, and also to prevent the emission of EMI.

Devices are known that shield external EMI so that a device such as an aircraft engine tester disposed within the shielding can function properly. These shielding devices are typically designed for use in environments in which the intensity of the EMI is not very high. For instance, at most commercial airports, although many types of communication and radar equipment are used, this equipment is not concentrated in a small area, resulting in an overall EMI of a lower intensity. These known shielding devices reduce EMI to usable levels so that the testing device enclosed within functions properly.

However, when these shielding devices are used in areas having very high intensity EMI, such as on an aircraft carrier having many types of communications equipment and radar located within a very small area, this same shielding cannot adequately reduce this high intensity EMI. Thus, devices enclosed within the shielding will not properly perform their intended function in this environment.

Therefore, a device for shielding portable aircraft engine testing devices in high intensity EMI environments is needed.

SUMMARY OF THE INVENTION

It is an object of the present invention to provide a device that encloses a portable aircraft engine tester and can shield very high intensity EMI.

It is another object of the invention to provide a device that encloses a portable jet engine tester and can shield very high intensity EMI.

It is still a further object of the invention to provide a device that encloses an aircraft engine testing device having many different types of switches, inputs, display screens, doors, and other surface components.

In order to attain the above objects of the invention, and others, the present invention provides an EMI shielding device that encloses a portable aircraft engine tester. The shielding device includes a portable, seamless, conductive, outer casing that has an open top and side openings. The side openings allow access to an internal printer and the input of measurement signals.

At the measurement signal input area of the outer casing, the side opening is covered by a conductive filter box that fits inside the outer casing. The filter box contains connectors, disposed at the side of the filter box abutting the side opening in the outer casing, for attachment of external cables. Thermocouple EMI filters, AC and DC signal EMI filters, and power EMI filters are also disposed within the filter box and electrically connected to the connectors so that maximum values of each signal will pass and EMI existing on these signals is substantially reduced.

Disposed within the filter box is a conductive partition that separates measurement signal inputs from a power input so that the power input signal cannot further distort measurement signals.

Over the open top of the outer casing is disposed a conductive deck that contains openings and holes for multiple switches, a window display, and a covered calibration switch access area.

The window display includes a conductive bezel, a plurality of EMI gaskets, a bronze woven screen, and an aluminum backup panel, along with a plastic window, to properly shield the display window opening in the deck.

Each of the switches, whether rotary, toggle, or push button, also are constructed to minimize the passage of EMI.

Conductive, aluminum panels cover both the calibration access opening and the printer access opening, are larger than the opening they cover, and are attached to the deck and outer casing, respectively, using a set of screws and captive locking fasteners, along with an EMI gasket.

Screws, captive locking fasteners, and EMI gaskets or run welds are used in other areas in which different conductive elements are attached so that open spaces do not occur.

An input for an internal pressure transducer is also constructed so that a minimum amount of EMI will pass.

These features, along with others mentioned hereinafter, result in a shielding device capable of dissipating high intensity EMI to a low level so that an aircraft engine tester disposed within the shielding will operate properly.

BRIEF DESCRIPTION OF THE DRAWINGS

These and other advantages of the present invention may be appreciated from studying the following detailed description of the preferred embodiment together with the drawings in which:

FIG. 13 is a top view of the deck of the shielding device according to the present invention;

FIGS. 22A and 22B illustrate attachment cables used in the present invention.

DETAILED DESCRIPTION OF THE PREFERRED EMBODIMENT

Figure 1:
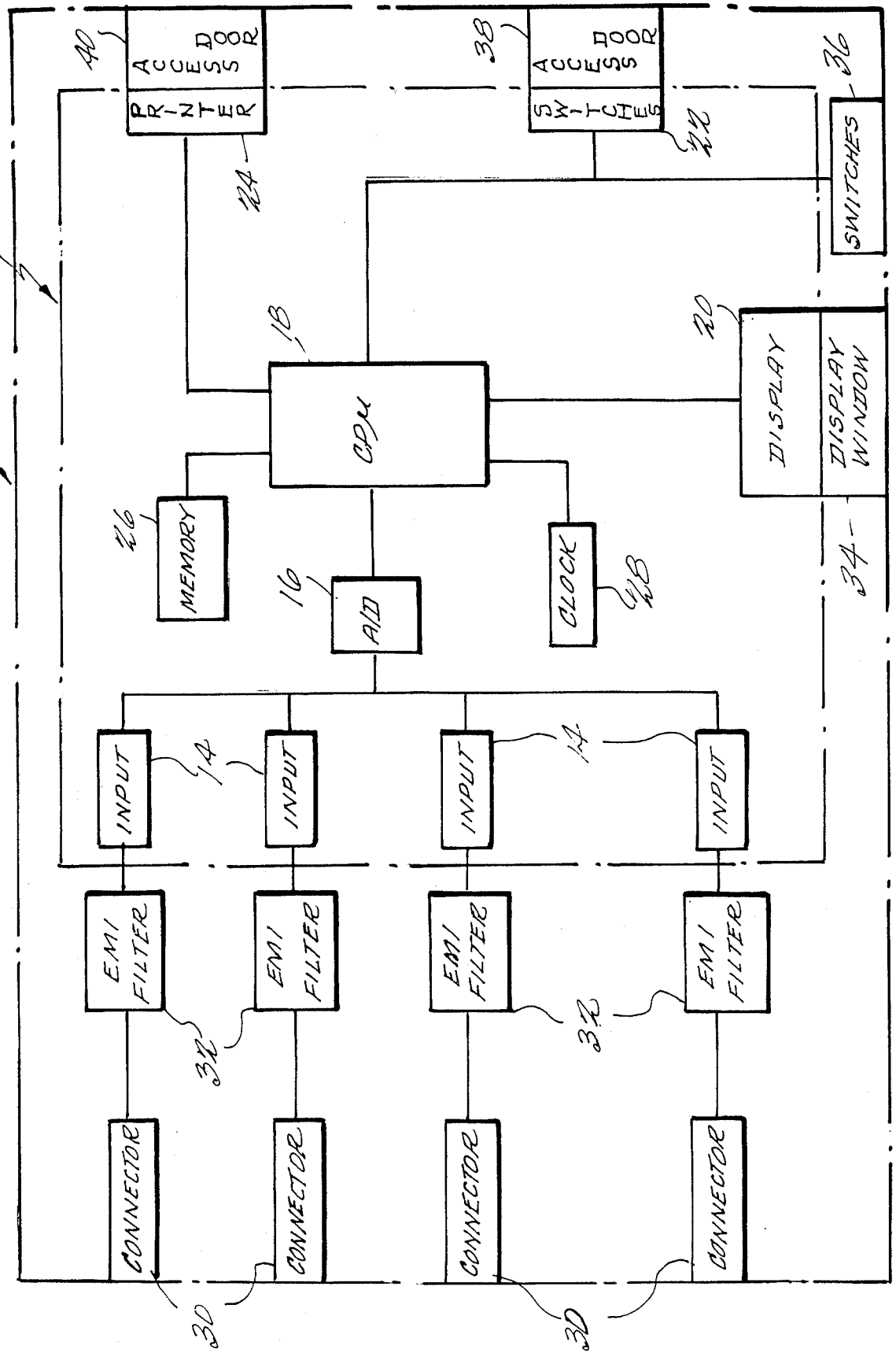
FIG. 1 a block diagram of an illustrative portable aircraft engine tester and the main components of the of the shielding device according to the present invention.

FIG. 1 illustrates a portable apparatus for shielding 10 that surrounds a portable aircraft engine tester 12. Portable aircraft engine tester 12 is shown for illustrative purposes only as containing various inputs 14, an analog to digital converter 16, a central processing unit 18, a display 20, switches 22, a printer 24, memory 26 consisting of, for example, a random access memory or a read only memory, and an internal clock 28. These components are illustrative only and are intended to show the type of components typically used by an aircraft engine testing device.

FIG. 1 also shows a plurality of connectors 30, a display window 34, switches 36, and access doors 38 and 40. These elements are necessary for communication between the external environment and the aircraft testing device. Access doors 38 and 40 are necessary to allow access to switches 22 and printer 24, respectively, connectors 30 are for external cable attachment, an display window 34 allows the viewing of light emitted from display 20. The construction of these elements, and others as further described, result in the shielding apparatus that makes up the present invention.

EMI filters 32, also shown in FIG. 1, perform EMI shielding functions described in more detail hereafter, and also complete the input path of measurement signals and electrical power through shielding apparatus 10 to aircraft engine tester 12.

Figure 2:
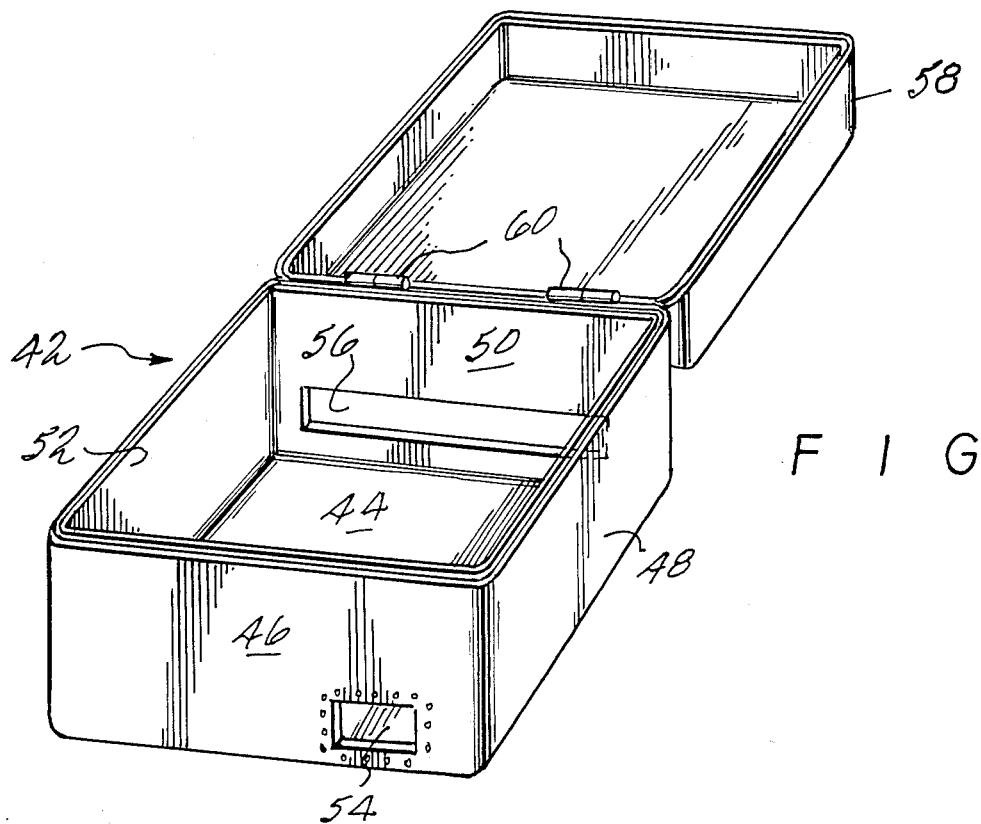
FIG. 2 is a perspective view of the outer casing of the shielding device according to the present invention.

Outer casing 42 is shown in FIG. 2 and is made of seamless aluminum that is 0.062 inches thick, has a bottom 44, and four sides 46, 48, 50, and 52. Front side 46 contains a side opening 54 and back side 50 contains a side opening 56. Outer casing 42 also contains an outer casing lid 58 fastened by hinges 60 and is attached to outer casing 42. Outer casing lid 58 is also made of seamless aluminum that is 0.062 inches thick. The outer casing 42 can be painted on the outside, but not on the inside where any joints with other conductive elements exist.

Figure 3:
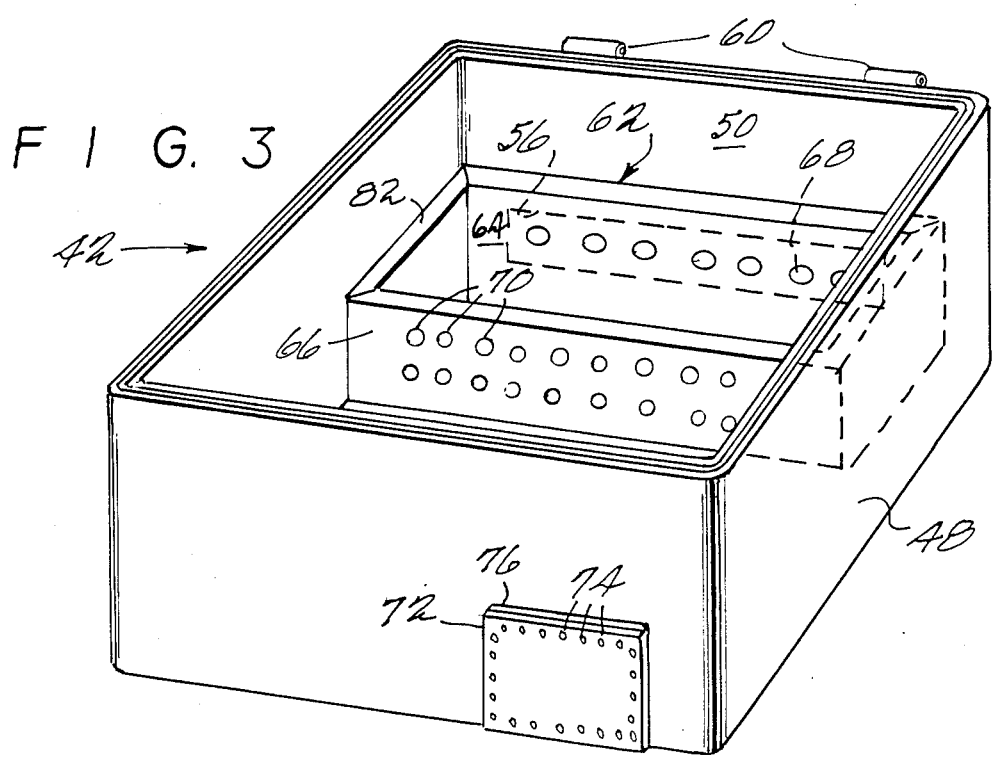
FIG. 3 is a perspective view of a filter box disposed within the outer casing of the shielding device according to the present invention.
Figure 7:
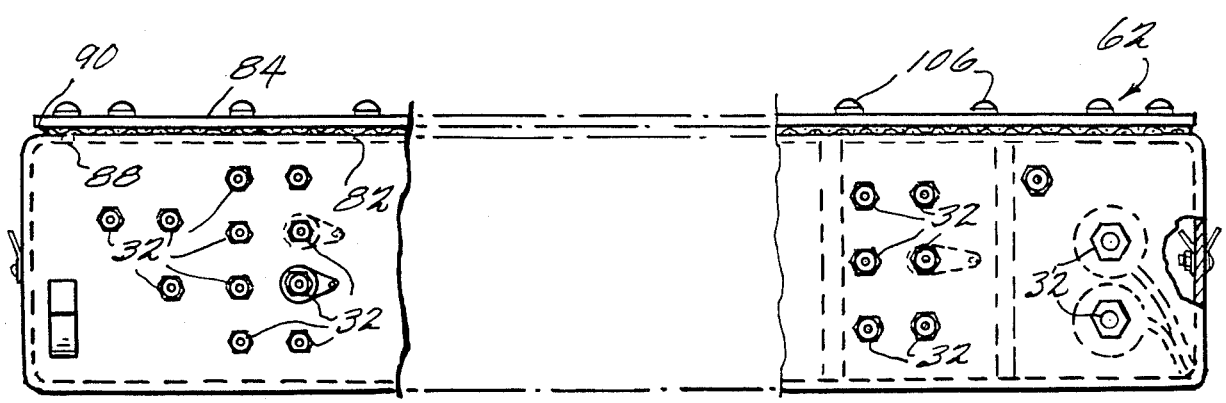
FIG. 7 is a cut-away front view of the filter box according to the present invention.

FIG. 3 shows filter box 62 disposed inside outer casing 42 so that back side 64 can be connected to back side 50 of outer casing 42 and cover side opening 56. A plurality of holes 68 exist in back side 64 and a plurality of holes 70 exist in front side 66. Holes 68 are positioned to align with side opening 56 in outer casing 42. Filter box 62 is made of seamless aluminum that is 0.062 inches thick and has a high conductivity finish where connections exist and contains flange 82 to which a top 84, shown in FIG. 7, is connected.

Also shown in FIG. 3 is side panel 72 that covers side opening 54 and is made of 0.125 inch thick aluminum. Side panel 72 is secured to outer casing 42 with a plurality of 0.25 inch diameter, quarter-turn D-ring fasteners 74 that are spaced at one inch intervals. Side panel 72 has dimensions large enough to fully cover EMI gasket 76 mounted to the surface of outer casing around side opening 54. This ensures tight contact between side panel 72, EMI gasket 76, and outer casing 42.

EMI gasket 76, and all other EMI gaskets referred to hereinafter, unless otherwise specified, are made of a monel wire mesh having, along the outer edge periphery, a neoprene sponge with a dry back adhesive for secure attachment of the EMI gasket. EMI gaskets 90, 114, and 254 are made of woven aluminum mesh impregnated with neoprene.

Figure 4:
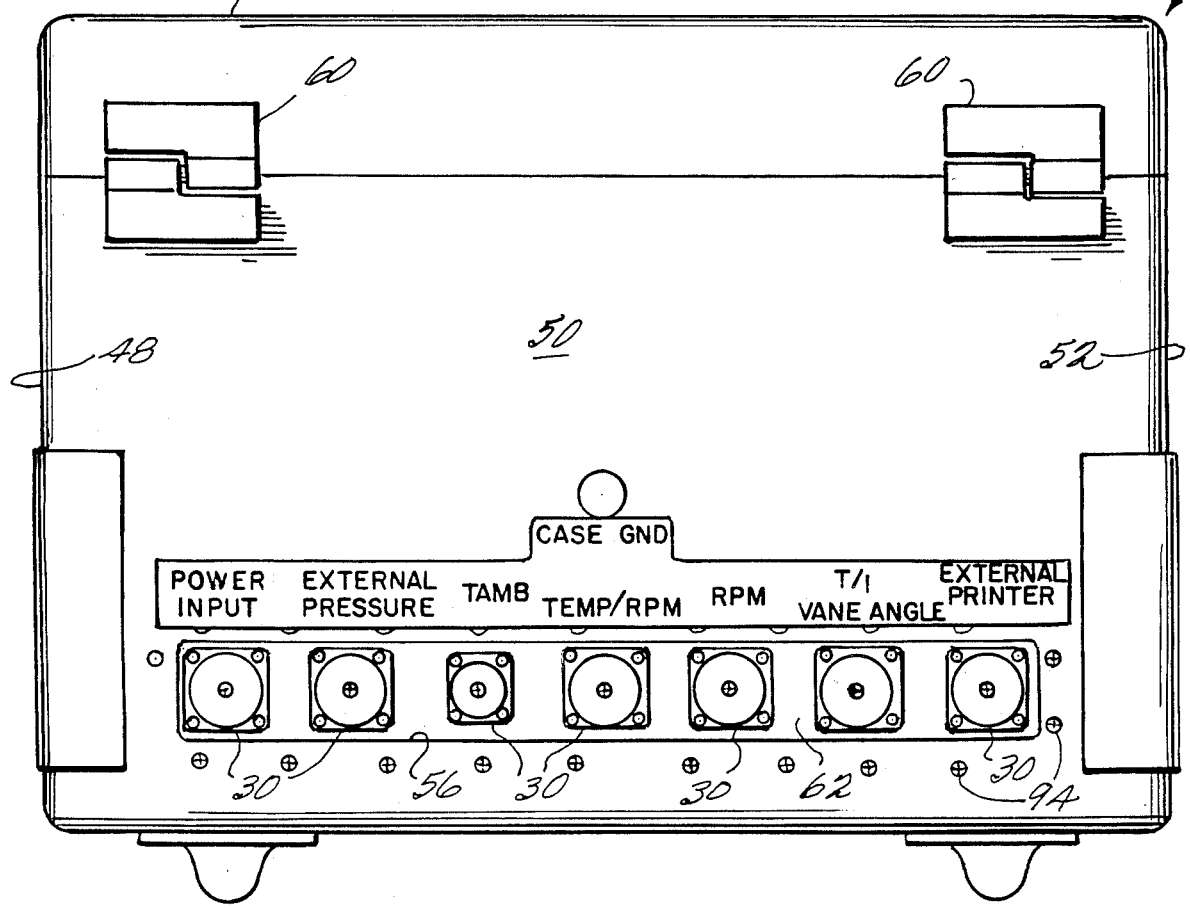
FIG. 4 is a side view of a back side of the shielding device according to the present invention.

FIG. 4 shows back side 50 of outer casing 42 and connectors 30 that are mounted within holes 68 shown in FIG. 3 of filter box 62. Each connector contains input contact points that establish electrical connection with conductors within the attachable cables. This is further described with reference to FIG. 22.

Figure 5:
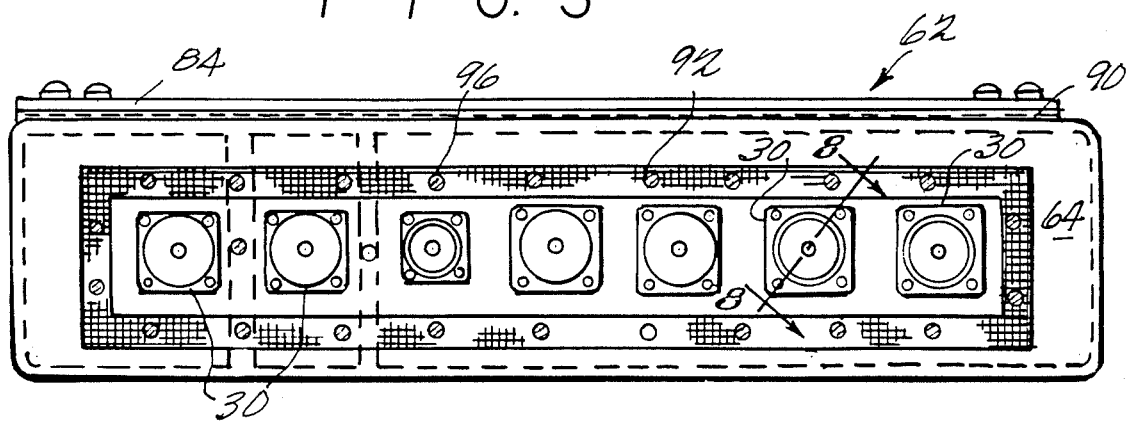
FIG. 5 is a view of the filter box according to the present invention.
Figure 6:
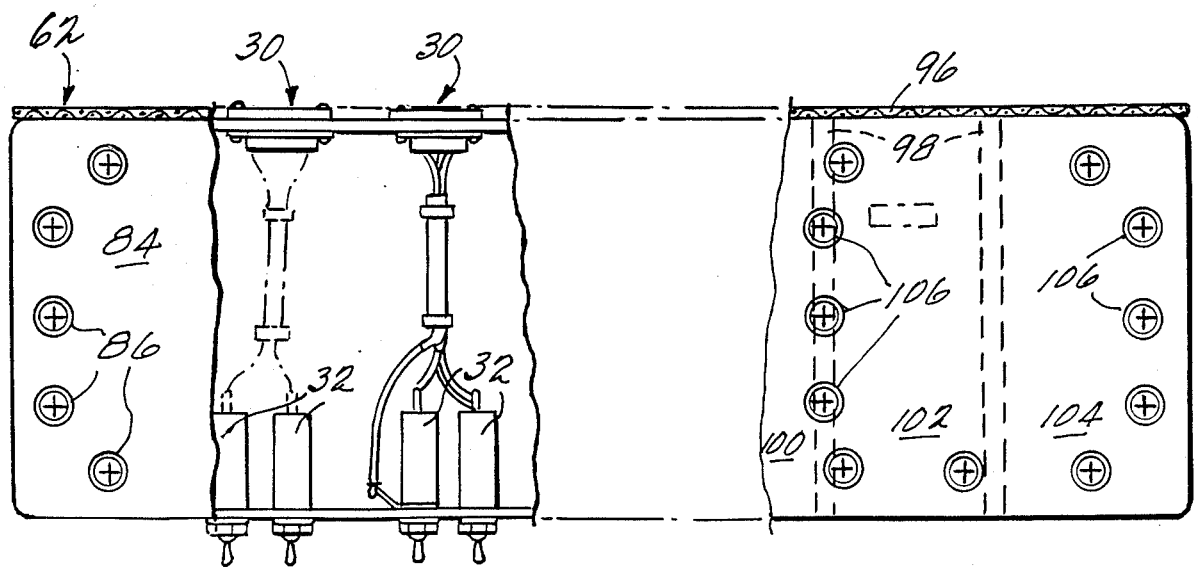
FIG. 6 a cut-away top view of the filter box according to the present invention.

FIGS. 5–7 further illustrate the construction of filter box 62 and the mounting of connectors 30 and EMI filters 32 in filter box 62. As shown in the cut-out portion of FIG. 6 (below flange 82) and FIG. 7, filter box 62 is formed with a flange 82 to which a top plate 84 is connected using a plurality of screws 86 mated to captive locking fasteners 88 secured in flange 82. A spacing of about one inch ensures continuous contact between flange 82 and top plate 84. Disposed between flange 82 and top plate 84 is aluminum mesh EMI gasket 90. Screws 86 are tightened to ensure that contact exists between the flange, top plate, and EMI gasket assembly.

As shown in FIG. 5, an EMI gasket 92 is located on the back side 64 of filter box 62 so that it is between back side 64 of filter box 62 and back side 50 of outer casing 42. Outer casing 42 and filter box 62 are then connected using a plurality of screws 94 (shown in FIG. 4) mated to captive locking fasteners 96 secured in back side 64 of filter box 62. A spacing interval of about one inch exists and screws 94 are tightened to ensure that contact exists between back side 64 of filter box 62, EMI gasket 92, and back side 50 of outer casing 42.

FIG. 6 shows, in phantom line, partition walls 98 that separate the plurality of connectors 30 and EMI filters 32 into areas 100, 102, and 104. Areas 100 and 102 contains connectors 30 and EMI filters 32 that input only measured signals. Area 104 contains only connectors 30 and EMI filters 32 that input electrical power. Partition walls 98 are made of a 0.190 inch thick aluminum sheet and are secured to filter box 62 using screws 106. A spacing between screws of about one inch is used.

Figure 8:
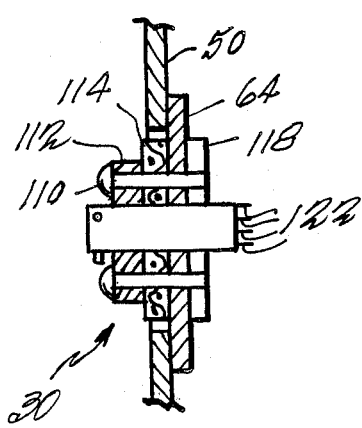
FIG. 8 is a section view taken along line 8—8 of FIG. 5 that shows the mounting of a connector on the filter box according to the present invention.

Connectors 30 are mounted to filter box 62 at holes 68 shown in FIG. 3 in a manner that ensures a conductive path. FIG. 8, which is a section view taken along line 8—8 of FIG. 5, shows a plurality of screws 110 that pass through mounting flange 112 of connector 30, an aluminum mesh EMI gasket 114, back side 64 of filter box 62, and screw into an inner mounting plate 118 of connector 30. Screws 110 are tightened to ensure that contact exists between each mounting flange 112, EMI gasket 114, and back side 64 of filter box 62. A plurality of electrical connection points 122 allow attachment between each contact within receptacle 120 and one EMI filter 32.

Figure 9:
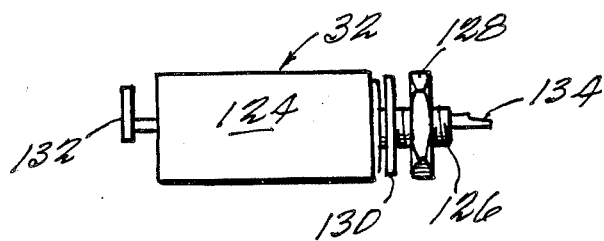
FIG. 9 is a side view of an EMI filter according to the present invention.

Each EMI filter 32 is mounted to filter box 62 at holes 70 at front side 66 of filter box 62. Each EMI filter 32, as shown in FIG. 9, contains a filter housing 124, a hollow connecting bolt 126 attached at one end to housing 124, a nut 128 screwable onto bolt 126, and a washer 130 for connection of EMI filter 32 to filter box 62. Protruding from the end of housing 124, opposite connecting bolt 126, is an electrical input contact point 132. Electrical signals output from EMI filters 32 are output through an electrical output contact point 134 outside hollow connecting bolt 126 and pass to, for example, A/D converter 16 shown in FIG. 1.

Figure 10:
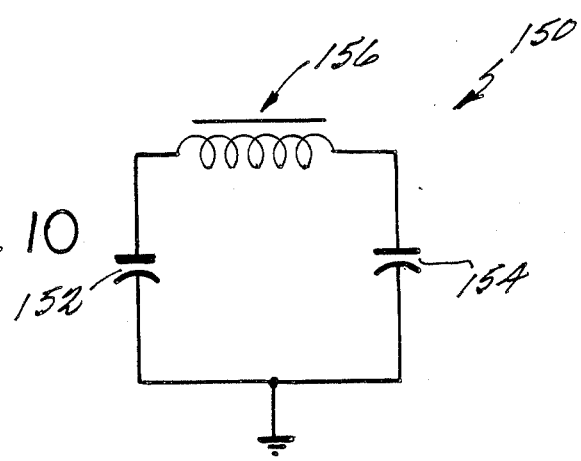
FIG. 10 a schematic diagram of a thermocouple and DC EMI filters according to the present invention.

The various EMI filters 32 used for inputting measurement signals from an aircraft engine, specifically a jet engine, will now be described with reference to FIGS. 10-12.

Depending upon the type of input measurement signal, a different EMI filter is necessary to ensure that the signal passes through to the aircraft engine tester and a maximum amount of EMI is eliminated. This is EMI that still finds its way to the signal path, despite protective EMI shielding.

EMI filters 32, used for inputting measurement signals from thermocouples disposed in a jet engine, are Pi filters specially designed from a basic Pi filter of type RF11980, manufactured by RF INTERONICS, located at 100 Pine Aire Drive, Bay Shore, Long Island, N.Y. 11706. This filter 150, shown schematically in FIG. 10, contains capacitors 152 and 154 and series inductor 156. Although the values of capacitors 152 and 154 and inductor 156 can be chosen to have a range of values, it is important that series inductor 15 is wound with constantan wire to maintain continuity of the thermocouple circuit and not introduce errors into the thermocouple signal.

Figure 11:
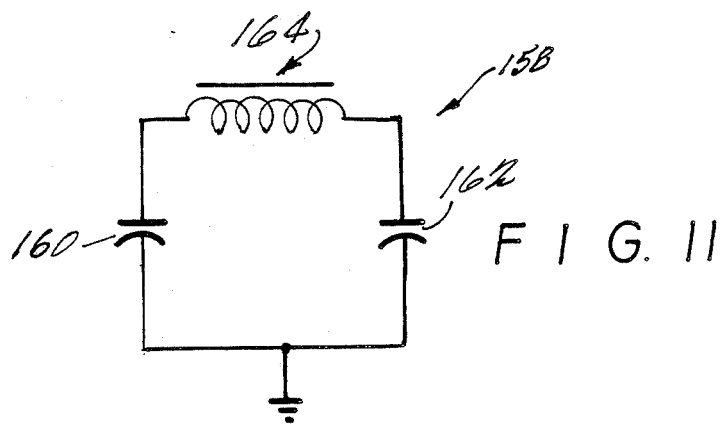
FIG. 11 is a schematic diagram of an AC signal EMI filter according to the present invention.

FIG. 11 shows the schematic diagram for an AC signal carrying EMI filter 158 that contains capacitors 160 and 162 having a capacitance of no larger than about 2000 pF. Series inductor 156 can have, for example, an inductance of 6.8 MHy and a resistance of 62 ohms, such as RF INTERONICS filter RF 11979. Filter RF 11979 permits the desired AC measurement signals to pass through to the tester with a minimum distortion while attenuating undesired EMI signals. AC signal carrying EMI filter 158 is used, for example, when inputting RPM or inlet guide vane AC measurement signals.

Signal lines that carry DC signals use RF 2550-24 EMI filters manufactured by RF Interonics. These filters pass the DC measurement signal and attenuate the undesired EMI signals. A Pi filter such as that illustrated in FIG. 10 is used. This filter differs from the use as a thermocouple filter by the series inductor 156 using copper wire rather than the constantan thermocouple wire.

Figure 12:
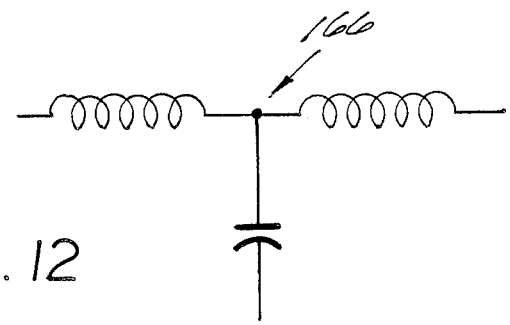
FIG. 12 is a schematic diagram of a power EMI filter according to the present invention.

Power supply EMI filter 166, for filtering 115 volt 50-400 Hz power, is schematically shown in FIG. 12 and can be, for example, filter 5004-6933 manufactured by The Potter Company, P.O. Box 337, Wesson, Miss., 39191 when a 115 volt power source is used. If a 28 volt DC power line is used, it is filtered using RF Interonics EMI filter RF 2550-24.

FIG. 13 shows deck 168 that covers the open top of outer casing 42 described in FIG. 2. Deck 168 is made of 0.16 inch thick aluminum.

Figure 14:
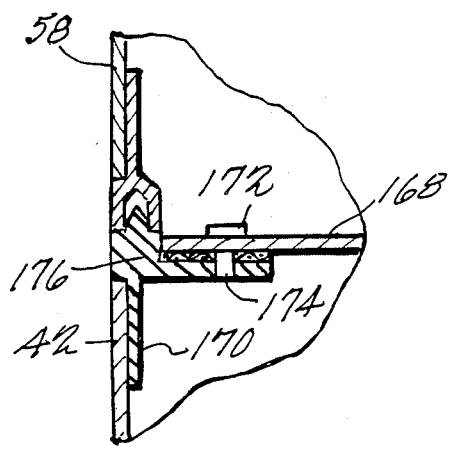
FIG. 14 illustrates a connection used between the outer case and the deck according to the present invention.

FIG. 14 further illustrates the connection between outer casing 42 and deck 168 in a section view taken along line 14—14 in FIG. 13, specifically showing conductive flange 170, made of seamless, extruded aluminum about 1 inch wide, that is connected to outer casing 42 with a continuous run weld and connected to deck 168 by a plurality of screws 172 that mate with captive locking fasteners 174 secured in flange 170 and tightened to ensure that no spacing exists. As shown in FIG. 13, screws 172 are spaced at intervals of about one inch.

EMI gasket 176, shown in FIG. 14, is disposed between deck 168 and flange 170 to ensure a conductive pathway.

Figure 15:
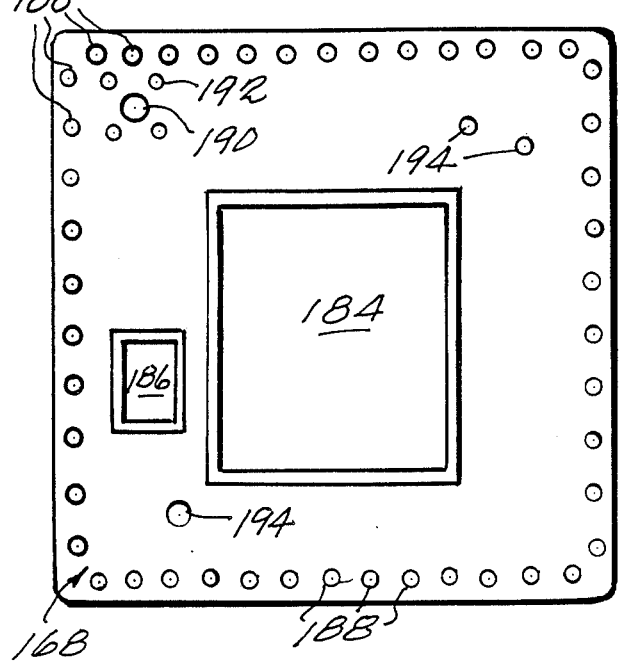
FIG. 15 shows the deck according to the present invention after holes and openings have been made and a conductive finish put on certain areas.

FIG. 15 illustrates the openings and holes that exist in deck 168. Top openings 184 and 186 are for display window 34 and top access door 38 as shown in FIG. 1. Holes 188, disposed around the periphery, are located at intervals of about one inch to receive screws 172 as previously described with reference to FIG. 14. Hole 190 receives a pressure connector hereafter described for connection of a hose to an internal pressure transducer that is part of portable aircraft engine tester 12 shown in FIG. 1. Holes 192 are for attachment of this connector. Holes 194 are for each of switches 36, which protrude through deck 168.

Also shown in FIG. 15 is that around each opening 184 and 86, and over each hole, the deck 168 is treated with a conductive finish to allow maximum conduction to exist between connected parts. This conductive finish can be used at each area where different parts are connected to obtain maximum EMI shielding.

Switches 36 are more specifically shown in FIGS. 13 and 16-18 as rotary switch 196, toggle switch 198, and push button switch 200. Only one type of each switch is shown in FIG. 13, but any combination and number of these switches can be used, depending on the number required to operate the aircraft engine tester disposed inside shielding apparatus 10. Each of these switches contains some type of EMI covering to further shield aircraft engine tester 12 from EMI, as discussed hereafter.

Figure 16:
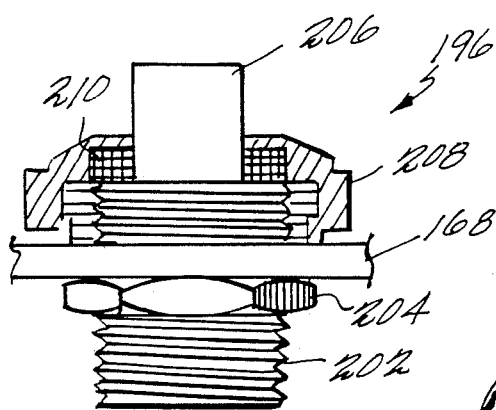
FIG. 16 illustrates a rotary switch having EMI shielding according to the present invention.

The construction of rotary switch 196 is shown in FIG. 16 and includes a standard rotary switch containing a hollow, threaded shaft 202, a threaded nut 204, and a shaft 206 protruding through an end of threaded shaft 202. Threaded shaft 202 protrudes outside deck 168 with a side of nut 204 abutting deck 168 on the inside. Rather than using another standard nut to secure rotary switch 196 from the outside, an EMI boot 208 is used that contains a monel wire mesh 210 that closely abuts shaft 206. This ensures that a minimum amount of EMI will pass through rotary switch 196. The various positions of rotary shaft that allow different electrical connections are disposed within hollow threaded shaft 202.

Figure 17:
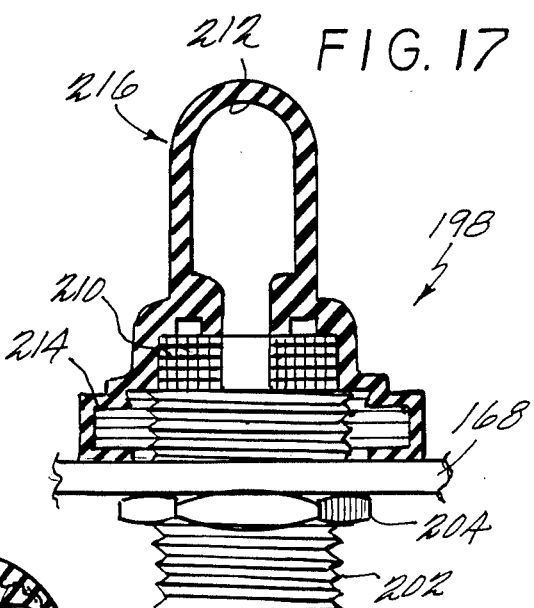
FIG. 17 illustrates a toggle switch having EMI shielding according to the present invention.

FIG. 17 shows the construction of toggle switch 198, in which a hollow threaded shaft 202 and threaded nut 204 as previously described with reference to FIG. 16 are used and electrical connections are similarly disposed within hollow, threaded shaft 202. Toggle shaft 212 protrudes above the end of hollow shaft 202 and is covered with a flexible cover 216 that covers nut 214. Monel wire mesh 210 closely abuts toggle switch shaft 212. This ensures that a minimum amount of EMI will pass through switch shaft 202.

Figure 18:
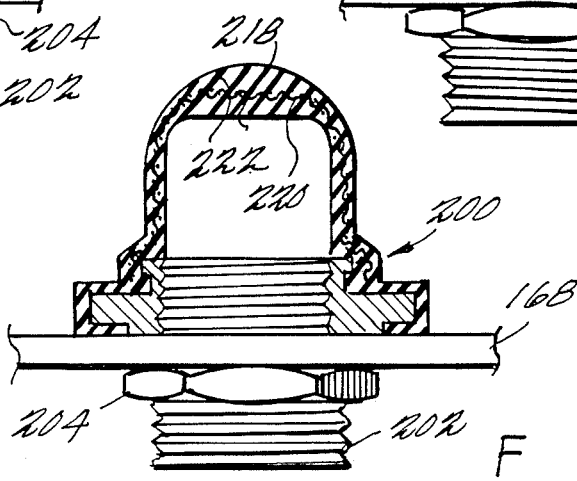
FIG. 18 illustrates a push button switch having EMI shielding according to the present invention.
Figure 14:
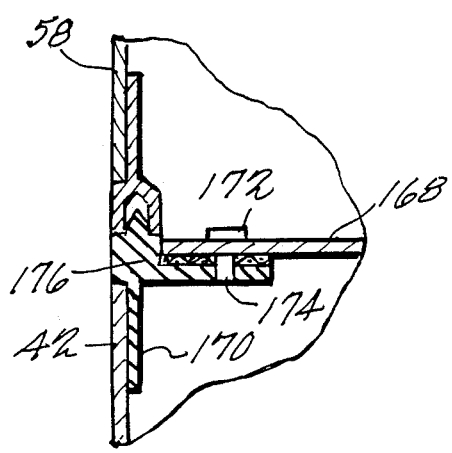
Figure 15:
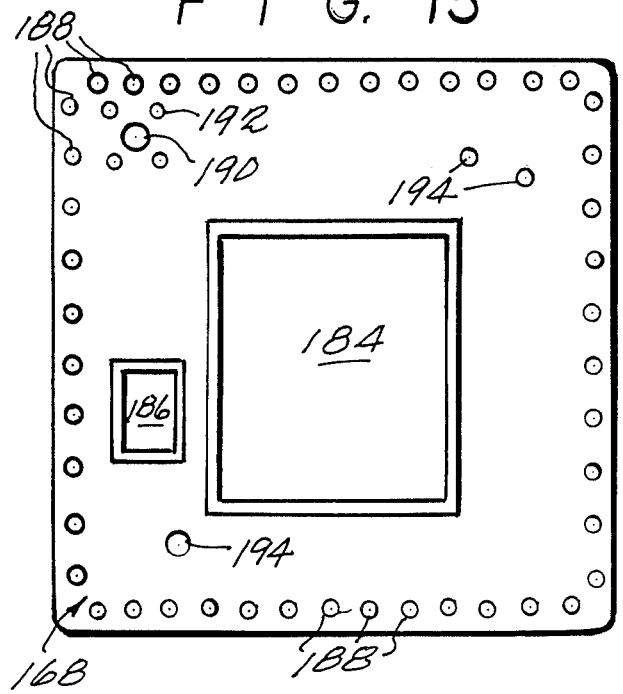
Figure 16:
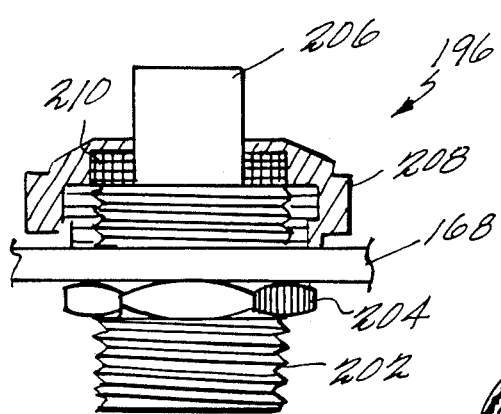
Figure 17:
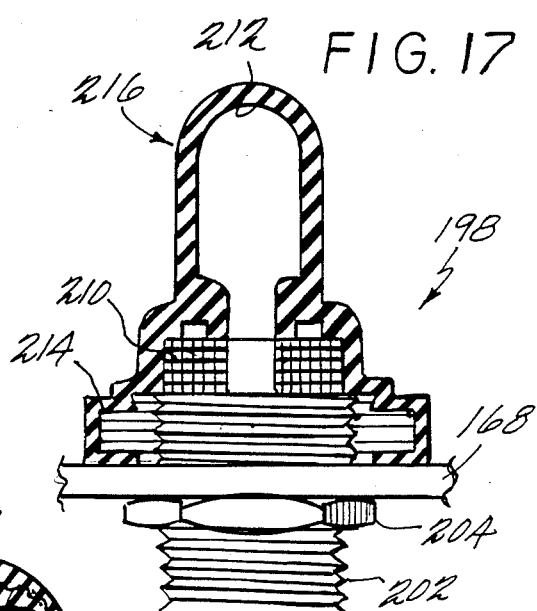
Figure 18:
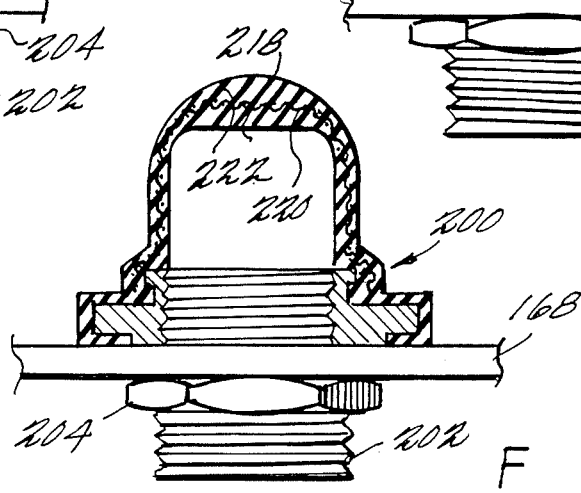

Push button switch 200, detailed in FIG. 18, includes a push button mechanism 218 that controls switching operations and is covered by monel wire mesh 220 for EMI shielding, which is disposed in a protective cover 222.

Figure 19:
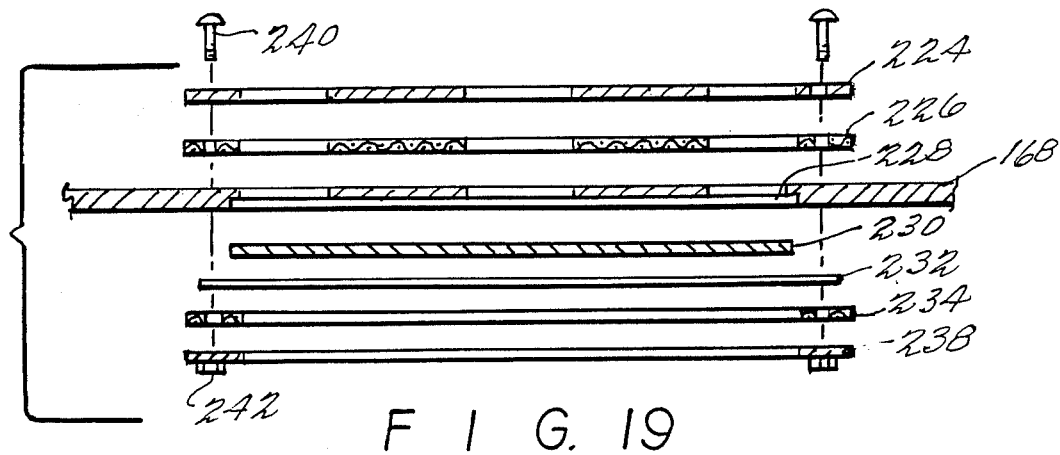
FIG. 19 is a top view of components making up the window display assembly according to the present invention.

FIG. 19 shows all components making up display window 36. Bezel 224 and EMI gasket 226 are both larger than opening 184 shown in FIG. 15. Deck 168 contains an edge 228 on its inner side in which polarized, plastic window 230 is placed. Over plastic window 230, on the inside of deck 168, is placed a bronze, woven screen 232 having dimensions that are larger than opening 184 and possessing 18×14 lines per inch. Disposed over woven screen 232, at its periphery, is another EMI gasket 234. To ensure that window 230 stays in place and conductive contact is kept between woven screen 232 and deck 168, a backup plate 238 secures this assembly together to ensure a compression fit. Backup plate 230 is made of 0.080 inch thick aluminum that has a high conductivity finish. Screws 240 fit through holes in each of the window elements, except window 232, and are screwably inserted into capture locking fasteners 242 disposed in backup plate 230.

Figure 20:
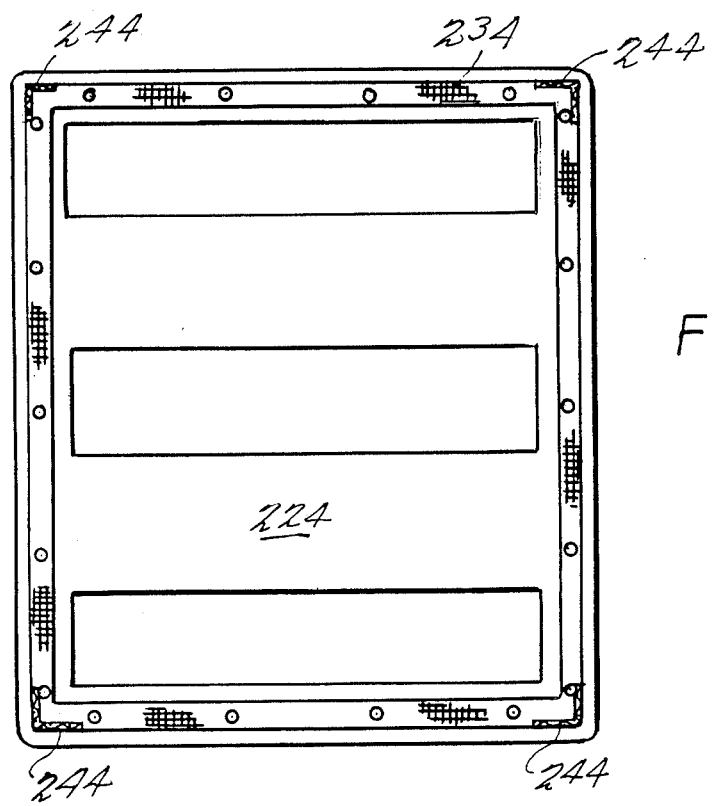
FIG. 20 is a side view of the window display assembly according to the present invention.

As shown in FIG. 20, each of the holes are spaced around the periphery of bezel 224 so that screws 240 have a spacing of one inch. EMI gaskets 226 and 234, and woven screen 232 and deck 168 have holes aligned with the holes of bezel 224. Heavy line 244 shown at the corners of woven screen 234 indicates that all edges, both corners as shown and the straight sections, are soldered after screen 234 is cut and before it is mounted in the assembly of display window 34. This prevents woven screen 234 from unravelling during manufacture.

FIG. 13 also shows a connector, but one that is not attached to an EMI filter 32. This connector is pressure input connector 246, and allows passage of pressurized air into aircraft engine testing device 10 so that an internal pressure transducer, not shown, can produce a measurement signal indicative of pressure.

Figure 21:
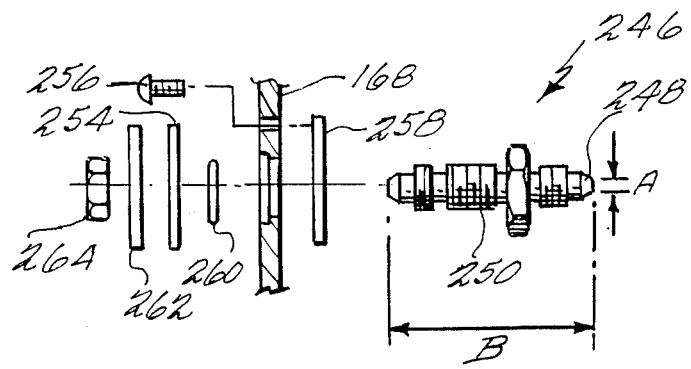
FIG. 21 is a section view taken along line 21—21 in FIG. 3 and shows the construction of a pressure input connector according to the present invention.

FIG. 21 more clearly shows the construction of pressure input connector 246, most notably the ratio one to ten of the diameter A of port opening 248 to the length B of port 248. This ratio only minimally disturbs the pressure of the air entering port 248 and maximizes the EMI shielding characteristics. Port 248 is formed by a stainless steel fitting 250.

Pressure input connector 246 is attached to deck 168 with four screws 256 that mate with anti-turn plate 258 after passing through deck 168. The protruding end of fitting 250 has placed over it an o-ring 268 that fits in deck 168, which, in turn, is covered by an EMI gasket 254, a washer 262, and a nut 264 to secure the assembly.

FIG. 13 also shows various conductive covers 250 that cover each connector 30. Although the shape and size of each cover 260 will vary, its purpose is to further shield each connector 30 when that connector is not being used.

Also shown in FIG. 13 is top panel 262, which covers opening 186 as shown in FIG. 15. Panel 262 is made of 0.125 inch thick aluminum and is secured by screws 264 that are spaced at one inch intervals around the periphery of panel 262 and mate with nuts, not shown, disposed in deck 168. An EMI gasket 266 is disposed between panel 262 and deck 168. A high conductivity finish exists on panel 262 and deck 168 where it is in contact with gasket 266.

FIGS. 22A and 22B show a cable 270, that is attached at cable connector 272 to a connector 30. Cable 270 contains a single or a plurality of conductors 274. Disposed over conductor 274 is insulation 276, over which is disposed conductive braided shielding 278. This conductive braided shielding 278 prevents EMI from interfering with the signal passing along the electrical pathway established by conductor 274.

Cable connector 272 is constructed so that each conductor 274 electrically contacts an input contact point of connector 30, while the shielding establishes a separate electrical path to ground potential via the metal shell of the connector. This ensures that the measurement signal is shielded from EMI at this junction.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A portable apparatus for shielding from EMI a portable aircraft engine tester having a plurality of aircraft engine measurement signal inputs that input measurement signals obtained from an aircraft engine, an electrical power input for inputting electrical power, and switches for controlling the aircraft engine tester, the portable shielding apparatus comprising:

a portable, seamless, conductive, outer casing having a bottom, four sides, and an open top, at least one of said sides including at least one side opening;

a conductive filter box disposed within said outer casing so that a back side of said filter box is connected to said outer casing and covers said at least one side opening, said filter box including:
  a plurality of holes located on said back side of said filter box within an area that corresponds to said at least one side opening, and
  a plurality of holes located on another side of said filter box;

a first EMI gasket disposed between said connected filter box and said outer casing;

a connector disposed within each of said plurality of holes on said back side of said filter box, said connectors having input contact points;

a plurality of second EMI gaskets disposed between said plurality of connectors and said filter box;

a plurality of EMI filters disposed within said filter box, each filter mounted at an end to one of said plurality of holes on said another side of said filter box, and including:
  at least one thermocouple EMI filter for filtering a thermocouple measurement signal, said thermocouple filter containing an inductor wrapped with constantan wire,
  at least one DC signal EMI filter for filtering a DC measurement signal,
  at least one AC signal EMI filter for filtering an AC measurement signal, and
  at least one power EMI filter for filtering an electrical power input signal;

a conductive deck having a plurality of holes and at least one top opening, said conductive deck connected to said sides of said outer casing to enclose said top of said outer casing;

a display window covering said at least one top opening, said display window including:

a conductive bezel that covers said at least one top opening and is connected to an outside of said deck, a third EMI gasket disposed between said bezel and said deck, a transparent plastic window disposed on an inside of said deck, a conductive woven screen that is larger than and covers said plastic window so that a periphery of said woven screen that touches an inside of said deck, a fourth EMI gasket disposed over said conductive woven screen, and a conductive backup plate disposed over said fourth EMI gasket for causing a compressive fit of said woven screen and fourth EMI gasket on an inside of said instrument; and a plurality of EMI switch coverings, one EMI switch covering for each of said switches.

2. An apparatus according to claim 1 wherein said bezel is connected to said deck with a first plurality of screws mated with captive locking fasteners spaced at substantially one per inch around a periphery of said bezel.

3. An apparatus according to claim 1 wherein said filter box includes:

a seamless, conductive, outer housing having an open top and an integral flange;

a conductive top covering said open top;

a fifth EMI gasket disposed between said integral flange and said conductive top; and a second plurality of screws mated with captive locking fasteners spaced at substantially one per inch around a periphery of said conductive top.

4. An apparatus according to claim 3 further including a conductive partition disposed in said filter box that separates said connectors and EMI filters inputting said measurement signals from said connectors and EMI filters inputting said electrical power.

5. An apparatus according to claim 4 wherein said conductive partition is attached to said filter box with a third plurality of screws.

6. An apparatus according to claim 1 wherein said outer casing, said filter box, and said bezel are made of aluminum.

7. An apparatus according to claim 3 wherein said deck and said outer casing are connected by a seamless, extruded, conductive flange that is run welded to said outer casing connected to said deck with a fourth plurality of screws mated with captive locking fasteners that are spaced at substantially one per inch around a periphery of said deck and includes a sixth EMI gasket disposed between said flange and said deck.

8. An apparatus according to claim 7 wherein said outer casing, said filter box, and said bezel are made of aluminum.

9. An apparatus according to claim 8 wherein said aluminum has a conductive finish where each of said screws ar located.

10. An apparatus according to claim 8 wherein said aluminum has a conductive finish in any area over which one of said EMI gaskets disposed.

11. An apparatus according to claim 1 further including a conductive, seamless, outer lid hinged to said outer casing so that when in a closed position it covers said deck.

12. An apparatus according to claim 1 wherein said outer casing includes a second side opening and further includes a conductive side access panel for covering said second side opening.

13. An apparatus according to claim 12 wherein said side access is larger than said side opening, is mounted over said side opening using a fifth plurality of screws spaced at substantially one inch intervals around a periphery of said side access panel, and contains a seventh EMI gasket disposed between said side access panel and said outer casing.

14. An apparatus according to claim 1 wherein:

one of said EMI switch coverings is a monel wire mesh that abuts a toggle switch shaft;

another of said EMI switch coverings is a monel wire mesh that abuts a rotary switch shaft; and a third of said EMI switch coverings is a flexible wire mesh disposed over a push button mechanism.

15. An apparatus according to claim 1 wherein said deck contains a second top opening and further includes a top access panel larger than said second top opening for covering said second top opening that is mounted over said second top opening using a sixth plurality of screws spaced at substantially one inch intervals around a periphery of said top access panel, and contains an eighth EMI gasket disposed between said top access panel and said deck.

16. An apparatus according to claim 1 further including a pressure input connector made of stainless steel having a port length that is ten times greater than a port diameter.

17. An apparatus according to claim 1 further including cables detachably attached to said connectors for establishing an electrical pathway between said aircraft engine and said connectors, said cables including an insulator disposed over a conductor and conductive braided shield disposed over said insulator.

* * * * *